(12) United States Patent
Ishitsuka et al.

(10) Patent No.: US 7,674,668 B2
(45) Date of Patent: Mar. 9, 2010

(54) METHOD OF MANUFACTURING A SEMICONDUCTOR DEVICE

(75) Inventors: Norio Ishitsuka, Kasumigaura (JP); Nobuyoshi Hattori, Itami (JP); Tomio Iwasaki, Tsukuba (JP)

(73) Assignee: Renesas Technology Corp., Tokyo (JP)

( * ) Notice: Subject to any disclaimer, the term of this patent is extended or adjusted under 35 U.S.C. 154(b) by 9 days.

(21) Appl. No.: 12/005,444

(22) Filed: Dec. 26, 2007

(65) Prior Publication Data

US 2008/0188043 A1    Aug. 7, 2008

(30) Foreign Application Priority Data

Dec. 26, 2006   (JP)   ............... 2006-348817

(51) Int. Cl.
 *H01L 21/336*   (2006.01)
 *H01L 21/265*   (2006.01)
(52) U.S. Cl. .................. 438/198; 438/305; 438/520
(58) Field of Classification Search ........... 438/198, 438/293, 520
See application file for complete search history.

(56) References Cited

U.S. PATENT DOCUMENTS

| | | | |
|---|---|---|---|
| 5,885,886 A | * | 3/1999 | Lee .......................... 438/528 |
| 6,218,224 B1 | * | 4/2001 | Lukanc et al. ............. 438/199 |
| 6,335,233 B1 | * | 1/2002 | Cho et al. ................... 438/199 |
| 2006/0057811 A1 | * | 3/2006 | Chou et al. ................. 438/305 |

FOREIGN PATENT DOCUMENTS

| | | |
|---|---|---|
| JP | 7142726 | 6/1995 |
| JP | 8078674 | 3/1996 |
| JP | 8097210 | 4/1996 |
| JP | 2000174270 | 6/2000 |
| JP | 2001015737 | 1/2001 |

* cited by examiner

*Primary Examiner*—Matthew C Landau
*Assistant Examiner*—Jessica Hall
(74) *Attorney, Agent, or Firm*—Townsend and Townsend and Crew LLP

(57) ABSTRACT

After a gate electrode is formed on a main surface of a semiconductor substrate, low concentration layers are formed on the main surface of the semiconductor substrate by implanting impurities therein, with using the gate electrode as a mask. Thereafter, first sidewalls and second sidewalls are formed on the both side surfaces of the gate electrode. Subsequently, nitrogen or the like is ion-implanted into the semiconductor substrate, with using the first sidewalls, the second sidewalls and the gate electrode as a mask, thereby forming a crystallization-control region (CCR) on the main surface of the semiconductor substrate. Then, after the second sidewalls are removed, high concentration layers for a source and a drain are formed on the main surface of the semiconductor substrate.

8 Claims, 8 Drawing Sheets

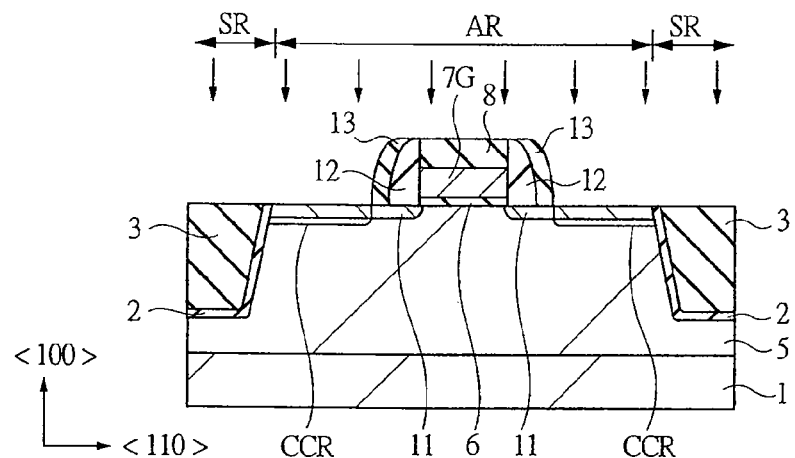
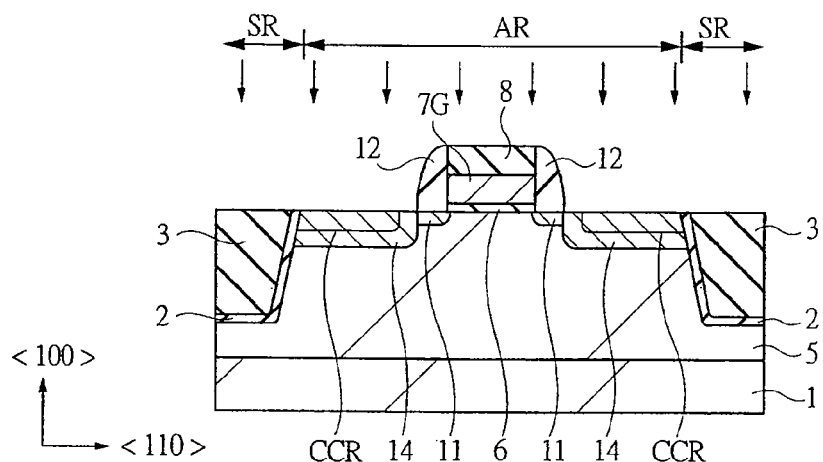
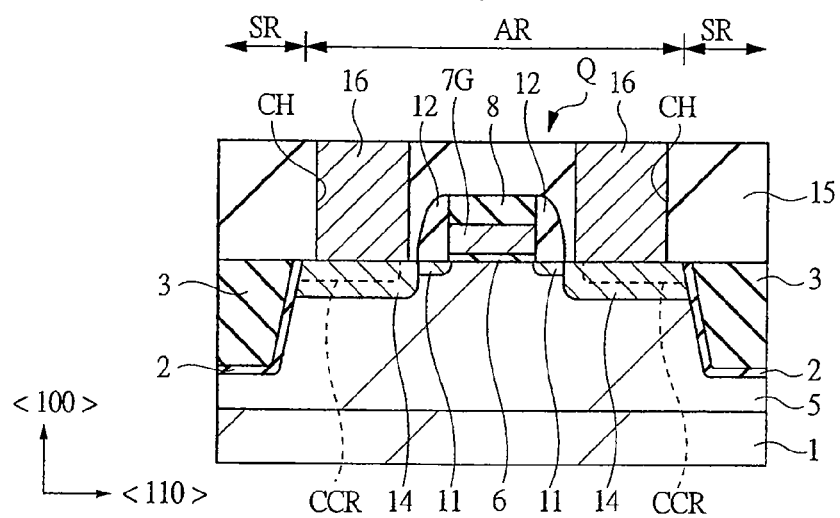

METHOD OF MANUFACTURING A SEMICONDUCTOR DEVICE

CROSS-REFERENCE TO RELATED APPLICATION

The present application claims priority from Japanese Patent Application No. JP 2006-348817 filed on Dec. 26, 2006, the content of which is hereby incorporated by reference into this application.

TECHNICAL FIELD OF THE INVENTION

The present invention relates to a manufacturing technique for a semiconductor device. More particularly, it relates to a technique effectively applied to a manufacturing technique of a semiconductor device including an impurity introduction step.

BACKGROUND OF THE INVENTION

In a step of introducing impurities to form a source region and a drain region of a MOS transistor, since the impurities are implanted into a semiconductor substrate in high concentration, the occurrence of crystal defects at the end portion of the region in the semiconductor substrate in which the impurities are implanted is often observed.

As a method of preventing the crystal defects, for example, Japanese Patent Application Laid-open Publication No. 8-97210 (Patent Document 1) has disclosed a structure in which an oxide film is interposed between a sidewall on the side surface of a gate electrode and its underlying semiconductor substrate.

Also, for example, Japanese Patent No. 3442154 (Patent Document 2) has described a technique for forming a nitrogen implantation region, which has an equal or deeper depth compared to the junction depth of a p-type source/drain region, along the whole junction region of the source/drain region so as to effectively suppress the diffusion of impurities caused by a heat treatment for electrically activating impurities.

Also, for example, Japanese Patent No. 3238551 (Patent Document 3) has disclosed a technique for suppressing leakage current, parasitic resistance, the short channel effect and the hot carrier effect as follows. That is, double sidewalls are formed on the side surfaces of a gate electrode on a semiconductor substrate, and deep n$^-$ diffusion layers are then formed in source and drain regions using the double sidewalls as a mask. Thereafter, only outer sidewalls are removed so as to leave inner L-shaped sidewalls. Subsequently, shallow n$^+$ diffusion layers are formed in the source and drain regions. Furthermore, after the L-shaped sidewalls are removed, an n$^-$ layer for LDD is formed by ion-implantation using the gate electrode as a mask.

Also, for example, Japanese Patent Application Laid-open Publication No. 2001-15737 (Patent Document 4) has described a technique for the purpose of suppressing the short channel effect. That is, deep impurity diffusion layers which are isolated from the ends of gate electrode in source and drain regions are first formed. Thereafter, a part of sidewalls in a stacked structure of side surface of the gate electrode is removed, and shallow impurity diffusion layers adjacent to the gate electrode are later formed.

Also, for example, Japanese Patent Application Laid-open Publication No. 2000-174270 (Patent Document 5) has disclosed a technique for suppressing the increase in parasitic resistance of impurity diffusion layers and simultaneously making impurity diffusion layers shallower. That is, after sidewalls are formed on the side surface of a gate electrode, impurities are ion-implanted by using the gate electrode and the sidewalls as a mask, and then first impurity diffusion layers are formed by applying a heat treatment. Thereafter, a silicide layer is formed on the exposed surfaces of the gate electrode and the semiconductor substrate, and then the sidewalls are removed. After that, impurities are ion-implanted by using the gate electrode as a mask and heat treatment is performed, whereby, second impurity diffusion layers shallower than the first diffusion layers are formed.

SUMMARY OF THE INVENTION

However, the inventors of the present invention have discovered that the structures in the foregoing patent documents cannot sufficiently suppress crystal defects occurring in active regions including source and drain regions of a semiconductor substrate.

The reason for this is as follows, the occurrence of the crystal defects is not only caused by stress of a gate electrode, but is greatly related to the dependence on a surface orientation with respect to a crystallization rate during the recrystallization in an annealing process after a part of semiconductor substrate is changed into an amorphous state by ion-implanting impurities therein to form source and drain regions.

For example, in a semiconductor substrate whose main surface has the (100) plane, when impurities are ion-implanted to form source and drain. regions, and then the recrystallization of the impurity implantation region takes place, the crystallization rate differs depending on each surface crystal orientation of the bottom surface, the side surface, and the crossing surface between the bottom surface and the side surface. In this case, the crystallization rate in the direction of the surface orientation <100> concerning the (100) plane corresponding to the bottom surface of the impurity implantation region is the fastest, and the rate in the direction of the surface orientation <110> concerning the (110) plane corresponding to the side surface of the impurity implantation region is the second fastest. However, since the rate in the direction of the surface orientation <111> concerning the (111) plane corresponding to the crossing surface between the bottom surface and the side surface of the impurity implantation region is extremely slow compared to those of other planes, it can be understood that the recrystallization is relatively delayed at the crossing part between the bottom surface and the side surface of the impurity implantation region and so minute defects occur. In addition, it can be understood that when the stress from the gate electrode or the sidewall insulator films on its side surfaces is applied to the minute defects, the minute defects are turned into large defects (dislocation) traversing a pn junction in the source and drain regions.

An object of the present invention is to provide a semiconductor device having an excellent performance obtained by suppressing the defects caused in source and drain regions of a field effect transistor formed on a semiconductor substrate and a manufacturing technique for the same.

The above-mentioned and other objects of and novel characteristics of the present invention will be apparent from the description of this specification and the accompanying drawings.

The typical ones of the inventions disclosed in this application will be briefly described as follows.

That is, according to the present invention, when recrystallizing an impurity implantation region formed by implanting impurities for forming source and drain regions of a field effect transistor into a semiconductor substrate, the dependence on a surface orientation with respect to a crystallization rate of the impurity implantation region is reduced.

The effects obtained by typical aspects of the present invention will be briefly described below.

That is, when recrystallizing an impurity implantation region formed by implanting impurities for forming source and drain regions of a field effect transistor into a semiconductor substrate, the dependence on a surface orientation of a crystallization rate of the impurity implantation region can be reduced, whereby the occurrence of defects in the semiconductor substrate is suppressed. In other words, it is possible to provide a semiconductor device having an excellent performance obtained by suppressing the defects occurring in source and drain regions of a field effect transistor formed on a semiconductor substrate and also a manufacturing technology for the same.

BRIEF DESCRIPTION OF THE DRAWINGS

FIG. 4 is a cross-sectional view of a principal part of a semiconductor device in a manufacturing process continued from FIG. 3;

FIG. 5 is a cross-sectional view of a principal part of a semiconductor device in a manufacturing process continued from FIG. 4;

FIG. 6 is a cross-sectional view of a principal part of a semiconductor device in a manufacturing process continued from FIG. 5;

DESCRIPTION OF THE PREFERRED EMBODIMENT

Hereinafter, embodiments of the present invention will be described in detail with reference to the accompanying drawings. Note that, in the Miller index notation, generally a bar symbol is placed on the top of a number when indicating a minus direction, but in this specification, for example, such as [−100] which is added with "−" symbol before a number is used instead of a number added with a bar symbol in convenience. Also, when indicating a particular plane and direction, ( ) and [ ] are used in representing thereof, respectively. When indicating an equivalent plane and direction in a single crystal semiconductor substrate, { } and < > are used in representing thereof, respectively.

First Embodiment

A manufacturing process for a semiconductor device according to the first embodiment will be described with reference to FIG. 1 to FIG. 6.

Figure 1:
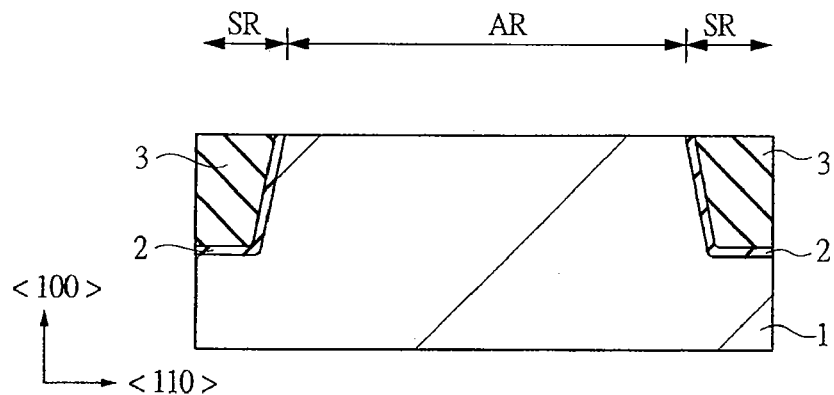
FIG. 1 is a cross-sectional view of a principal part of a semiconductor device in a manufacturing process according to an embodiment (first embodiment) of the present invention.

First, a semiconductor substrate is prepared as shown in FIG. 1. The semiconductor substrate 1 is made of, for example, single crystal silicon (Si), and the main surface thereof is to be the (100) plane. Shallow trenches are formed on the main surface of the semiconductor substrate 1 in perpendicular to and parallel to the <110> direction. The trenches are thermally oxidized at about 1000° C., thereby forming thermal oxide films 2 with 5 to 20 nm thickness.

Thereafter, the trenches are filled with an embedded oxide film 3 formed by a CVD (Chemical Vapor Deposition) or a sputtering method. Then, in order to remove voids therein, the embedded oxide films 3 is made to be densely packed by performing an annealing treatment in diluted oxidation atmosphere or nitrogen atmosphere at 1000 to 1150° C. for one to two hours.

Furthermore, the unnecessary embedded oxide film 3 on the semiconductor substrate 1 is planarized and removed, whereby shallow trench isolation regions SR, (shallow trench isolation (STI) region), are formed. Other regions except the shallow trench isolation regions SR become active regions (AR).

Figure 2:
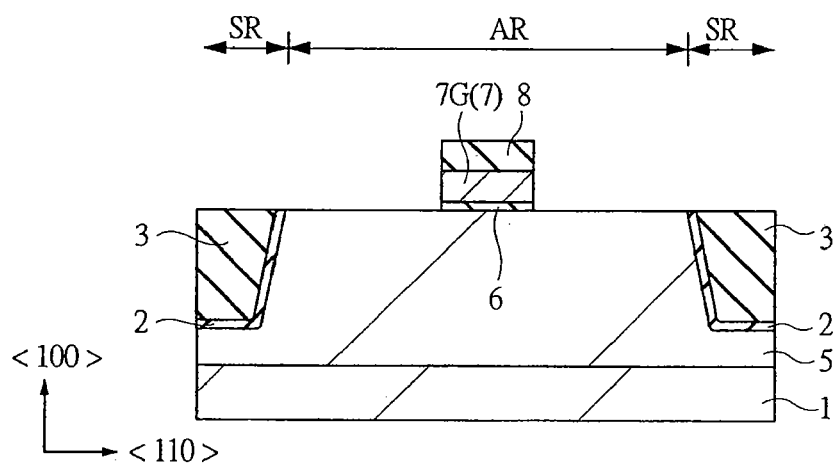
FIG. 2 is a cross-sectional view of a principal part of a semiconductor device in a manufacturing process continued from FIG. 1.

Next, as shown in FIG. 2, a thermal oxide film having about 10 nm thickness is formed by performing a heat treatment to the surface of the semiconductor substrate 1 at 900° C. in oxygen atmosphere. After that, an impurity such as boron (B) or arsenic (As) is implanted into the substrate with the impurity concentration of about 1×10¹³ atoms/cm² using this thermal oxide film as a buffer layer, thereby forming a well layer 5.

Thereafter, the thermal oxide film is removed by diluted hydrofluoric acid (HF). Then a gate oxide film 6, a polysilicon film 7, and an insulator film 8 made of a silicon dioxide film and the like are sequentially deposited. A gate electrode 7G is then formed by patterning the stacked layer. At this time, the longitudinal direction of or the short side direction of the gate electrode 7G is set to be perpendicular or parallel to the <110> direction.

Figure 3:
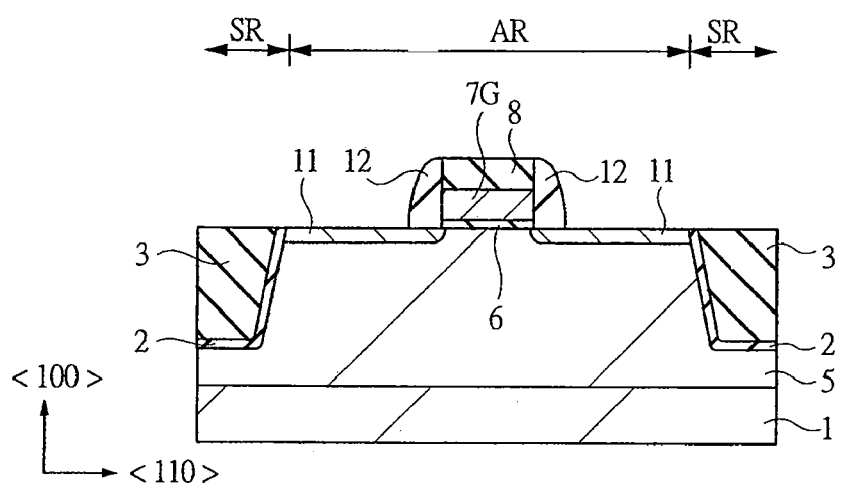
FIG. 3 is a cross-sectional view of a principal part of a semiconductor device in a manufacturing process continued from FIG. 2.

Next, as shown in FIG. 3, a thermal oxide film having 3 to 10 nm thickness is formed on the surface of the semiconductor substrate 1 by applying a heat treatment to the semiconductor substrate 1 in oxygen atmosphere at 900° C. Subsequently, boron (for P channel type MOS·FET) and arsenic (for N channel type MOS·FET) are implanted into the semiconductor substrate 1 with the impurity concentration of about 1×10¹³ atoms/cm² using this thermal oxide film as a buffer layer, thereby forming low concentration layers 11.

Thereafter, an insulator film made of, for example, a silicon dioxide film is deposited on the semiconductor substrate 1, and then first sidewalls 12 (first gate film, first side wall insulator film) are remained only on the sidewalls of the gate electrode 7G by etching back the insulator film with an anisotropic dry etching method. In this manner, a lightly doped drain (LDD) structure is formed.

Next, as shown in FIG. 4, an insulator film or a semiconductor film is deposited again in a thickness range of 10 to 30 nm on the semiconductor substrate 1. And then second sidewalls 13 (second gate film, second sidewall insulator film) are formed on the sidewalls of the gate electrode 7G via the first sidewalls 12 by anisotropic dry etching.

Preferably a material of the second side wall 13 should have higher etching selectivity compared to those of the first sidewall 12 and the insulator film 8, so an insulator film such as silicon nitride is adopted. However, the material of the second sidewall 13 is not limited to the above-mentioned materials and may be varied in material. For example, a semiconductor film such as polysilicon may be adopted. On the other hand, when the material of the first sidewall 12 and the insulator 8 is silicon nitride, the second sidewall 13 is made of a silicon dioxide film or the like.

Thereafter, nitrogen (N₂) is implanted into the semiconductor substrate 1 at 20 to 40 KeV and with the impurity concentration of about 1×10¹⁵ to 3×10¹⁵ atoms/cm² by using the second sidewalls 13 as a mask, thereby forming a crystallization-control region (CCR).

The end portion of the crystallization-control region (CCR) on a side of the gate electrode 7G is separated from the end portion of the gate electrode 7G by the distance of the widths of the first sidewall 12 and the second sidewall 13. In other words, the end portion of the CCR is formed at the positioned of the side surface of the outer second sidewall 13.

Thereafter, as shown in FIG. 5, all the second sidewalls 13 are selectively removed. Boron (for P channel type MOS·FET) and arsenic (for N channel type MOS·FET) are then implanted into the semiconductor substrate 1 at 50 KeV with the impurity concentration of about 5×10¹⁴ to 3×10¹⁵ atoms/cm². Subsequently, high concentration layers 14 to be a source or a drain are formed by annealing at about 1000° C.

The junction depth of the high concentration layer 14 reaches a position deeper than that of the crystallization-control region CCR. Meanwhile, the end portion of the high concentration layer 14 on the side of the gate electrode 7G is located almost at the position of the side surface of the first sidewall 12. Therefore, the high concentration layer 14 includes a region close to the first sidewall 12 relative to the crystallization-control region CCR. In other words, the crystalization-control region CCR is included in the high concentration layer 14. However, the junction depth of the high concentration layer 14 may be shallower than that of the crystallization-controlled region CCR.

Next, as shown in FIG. 6, after an oxide film 15 is deposited on the semiconductor substrate 1, contact holes CH in which a part of the high concentration layers 14 for a source and a drain is exposed are formed in the oxide film 15.

Thereafter, a conductive film such as tungsten is deposited on the oxide film 15 on the semiconductor substrate 1 so that the contact holes CH are filled with the conductive film. After that, unnecessary parts of the conductive film are removed by a chemical mechanical polish method or an etch-back method in order to make plugs 16 in the contact holes CH. The plugs 16 are electrodes electrically connected to the high concentration layers 14 for a source and a drain. In this way, a MOS·FET Q is formed on the semiconductor substrate 1. In addition, a silicide layer may be provided between the plug 16 and the semiconductor substrate 1. Also, the plug 16 may be made of a polysilicon film.

Next, the working effects according to the first embodiment will be described.

First, the occurrence mechanism of crystal defects will be explained. A sample is prepared for examining the occurrence mechanism of crystal defects as follows. Some oxide film patterns whose widths are gradually varied are made in a stripe shape on a semiconductor substrate, and arsenic (As) is implanted into the exposed surface of the semiconductor substrate with the same concentration as that of a source and a drain. The film widths are varied to obtain different stresses generated at each end portion of the films.

The result of plane transmission electron microscope (TEM) observation after an annealing treatment has proven that, in the occurrence of crystal defects, first, minute defects happen at the end portion of the film, and then the minute defects are grown into large defects (dislocation) traversing a pn junction due to the stress of the film. This result leads to the conclusion that if minute defects are suppressed, large defects (dislocation) causing electrical influences are also suppressed.

Figure 7:
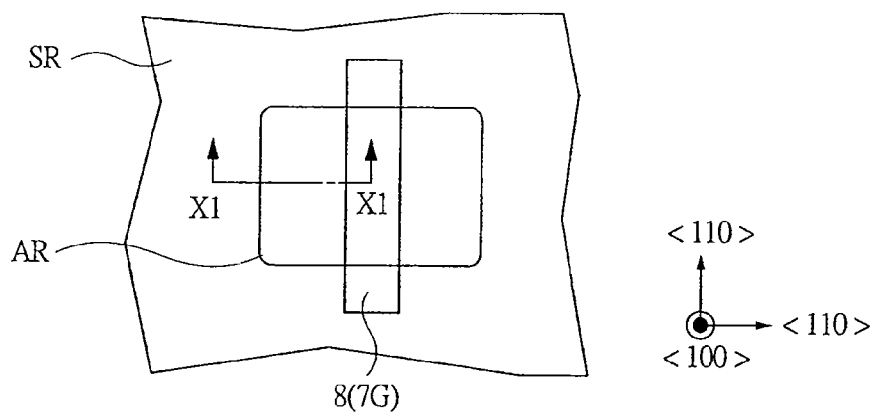
FIG. 7 is a plan view of a principal part of a semiconductor device according to the first embodiment of the present invention.
Figure 8:
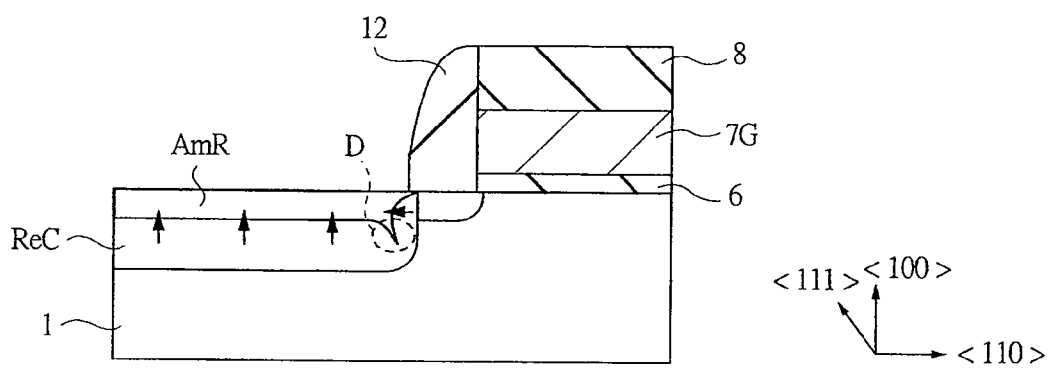
FIG. 8 is a cross-sectional view taken along the line X1-X1 in FIG. 7.

Accordingly, the occurrence mechanism of minute defects has been examined. FIG. 7 and FIG. 8 show the result of the examination. FIG. 7 is a plan view of a principal part of the semiconductor substrate 1 and FIG. 8 is a cross-sectional view taken along the line X1-X1 in FIG. 7. In FIG. 8, ReC denotes a recrystallization region and AmR denotes an amorphous region.

According to the result of the examination, as shown in FIG. 8, when performing an impurity implantation for forming a source and a drain, the semiconductor substrate 1 is changed into an amorphous. Thereafter, while this amorphous layer is recrystallized by annealing for activation, the amorphous region AmR is recrystallized on and from the interface between the amorphous region and the single crystal Si region. At this time, since the crystallization rate has the dependence on the crystal surface orientation, minute defects D are generated. The crystallization rate increases in order of (111) plane<(110) plane<(100) plane. Particularly, the crystallization rate of the (111) plane is extremely slow compared to those of other planes. Therefore, lattice dislocations are formed and the minute defects D are generated in this parts of the (111) plane.

Although there exist other planes, the three planes exhibit the characteristic features. In the first embodiment, the boundary interface between the amorphous region and single crystal Si region always includes the planes of (111), (110) and (100). Since the crystallization rate of (111) plane is particularly slow compared to other planes, the minute defects D are frequently formed on the (111) plane (recess portion of the impurity ion-implantation region). These results that show the dependence on the surface orientation with respect to the crystallization rate should be reduced in order to suppress the minute defects D.

Figure 9:
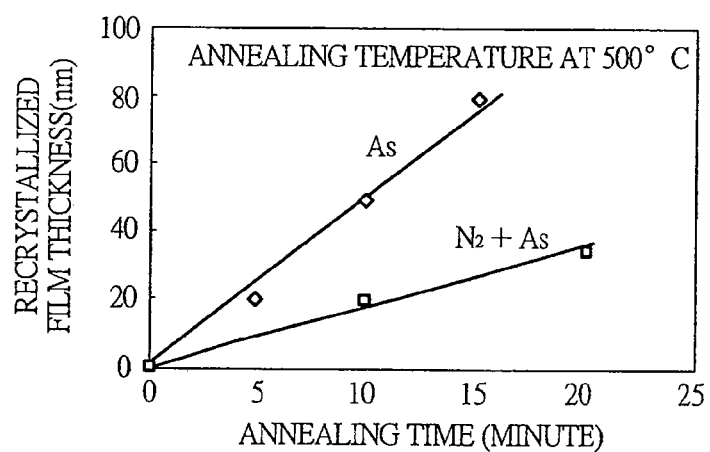
FIG. 9 is a graph showing the relations between an annealing time and a crystallization rate in both cases of implanting only arsenic, and implanting nitrogen and arsenic into semiconductor substrates.

Next, a method of reducing the dependence on the surface orientation with respect to the crystallization rate has been examined. It is known that when nitrogen (N), argon (Ar), oxygen ($O_2$), or carbon (C) is implanted into the semiconductor substrate 1 and an annealing treatment is then performed, the implanted atoms enter between the lattice points of Si. In this case, it is thought that when Si atoms are recrystallized (rearrangement) from an amorphous state, the crystallization rate is reduced because the atoms present between lattice points hamper the crystallization. In order to confirm the phenomenon, the crystallization rate in the case of implanting only arsenic (As) into the semiconductor substrate and that in the case of implanting nitrogen (N) and arsenic (As) into the semiconductor substrate 1 are examined. As a result, it can be understood that that the crystallization rate in the case of implanting nitrogen and arsenic is slower than that in the case of implanting only arsenic as shown in FIG. 9. Also, as results of the same experiment on argon (Ar), oxygen ($O_2$) and carbon (C), it is confirmed that each crystallization rate is reduced. The order of the superiority (order of effectiveness) of the impurity to be implanted is argon, nitrogen, oxygen and carbon in descending order.

If the crystallization rate of the (100) plane which is the fastest can be suppressed while maintaining the other crystallization rates of the (110) and (111) planes, it is possible to reduce the dependence on the crystal surface orientation with respect to the crystallization rate at the recess portion of the impurity implantation region of the end portion of the gate (end portion of the gate film). In the case where the (100) plane is used as the main surface of a semiconductor wafer and patterns are formed in the <110> direction, an amorphous layer at the end of the LDD has the (110) plane and the (111) plane in addition to the (100) plane (in the vicinity of the generation region of the minute defects D in FIG. 8). More specifically, if nitrogen or other impurities are not implanted into the end portion of the LDD where a source and a drain are formed, the dependence on the surface orientation with respect to the crystallization rate can be reduced.

Figure 10:
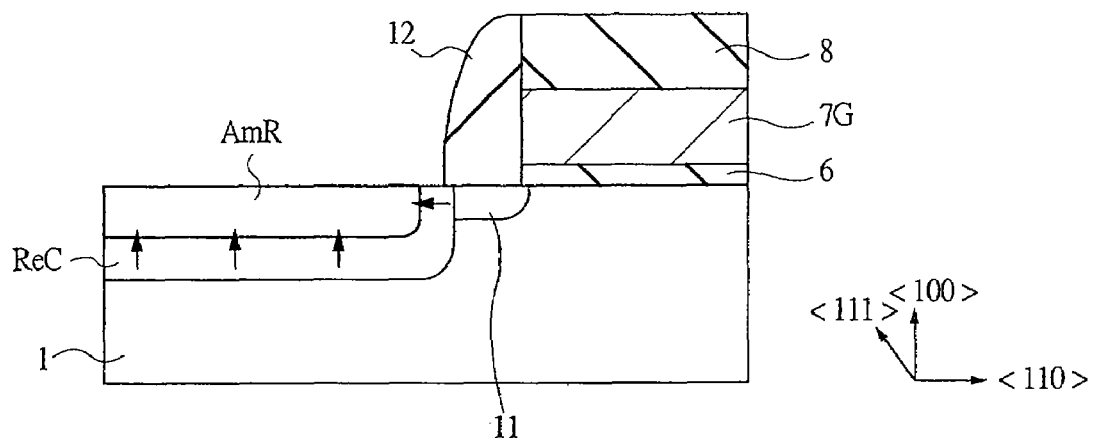
FIG. 10 is an explanatory view describing the effect of a semiconductor device according to an embodiment (first embodiment) of the present invention.

In the first embodiment, in order to realize the above-mentioned aspect, after the LDD film is formed, a film is deposited on the sidewall of the LDD film, and then nitrogen or the like is implanted. Thereafter, the film is removed, and boron or the like is implanted with a high concentration. By doing so, since nitrogen is not implanted into the (100) plane and the (111) plane of the end portion of the LDD, the crystallization rate does not slow down. In contrast, since nitrogen exists only in the (100) plane, the crystallization rate with respect to this plane direction slows down. Accordingly, the dependence on the surface orientation with respect to the crystallization rate in the generation region of the minute defect can be reduced. FIG. 10 shows that state. In this case, the (111) plane, the (110) plane and the (100) plane are almost evenly recrystalized.

According to the first embodiment, since the dependence on the surface orientation with respect to the crystallization rate can be reduced as described above, the occurrence of the minute defects D can be suppressed, and further, the occurrence of large defects (dislocation) traversing a pn junction, which causes undesirable electrical influence, can be suppressed or prevented.

In addition, since the minute defects D are frequently generated by the stress under the first sidewall 12 (particularly, in the case where the first side wall 12 is made of silicon nitride), a thick silicon dioxide film or the like is required to be formed under the first sidewall 12 to buffer the stress. In contrast, according to the embodiment, since the occurrence of the minute defects D can be suppressed by reducing the dependence on the surface orientation with respect to the crystallization rate as described above, there is no need to form the thick silicon dioxide film or the like under the first side wall 12, and the material for an insulator film to be formed under the first sidewall 12 can be selected without any trouble.

When forming a source, a drain and others, arsenic, phosphorus and boron are implanted into a semiconductor substrate. Since silicon atom radius differs from those of these elements, when these elements are entered into the lattice points of silicon as a substitutional atom by a subsequent annealing for activation, the difference in the atomic radii causes distortions. In the case where an implanted element is in high concentration ($3 \times 10^{14}$ atoms/cm$^2$), the distortion becomes larger in proportion to the amount thereof, so this distortion definitely contributes to the minute defects. As the result of measuring the distortion (stress), the distortion in all elements tends to increase when the concentration of the implanted elements is $5 \times 10^{14}$ atoms/cm$^2$ or more. Therefore, the first embodiment is effective when the concentration of arsenic, phosphorous, and boron is $5 \times 10^{14}$ atoms/cm$^2$ or more.

Meanwhile, even when the minute defects occur, there is no electrical influence as long as the minute defects do not grow into large defects (dislocation) traversing a pn junction. The widths of films are varied (in practice, widths of gate electrodes are simulated) in the experiment of the occurrence mechanism of minute defects described above, but an STI stress is larger than the stress caused by this film. This STI stress is a stress caused by the shallow trench isolation (STI). The details thereof will be described below.

That is, the shallow trench isolation region (STI region) is formed by forming the trench in the semiconductor substrate 1 and filling it with the embedded film as described above, and there exist many steps for oxidizing a semiconductor substrate during the process of forming transistors. Therefore, since oxygen to be an oxidizing species diffuses into the interior of the trench through the embedded film, and it reaches the sidewall of the trench, and an oxide film is grown thereon. When silicon is changed into silicon dioxide ($SiO_2$), the volume thereof is almost doubled. However, since this volume expansion is restricted by the embedded oxide film, the high compression stress occurs in the semiconductor substrate. This stress is named the STI stress.

According to the result of stress analysis, the film stress effect on the minute defect region is as small as about 100 Mpa in the case of using a silicon nitride film formed by CVD (the generated stress is the largest at the end portion of the film, but the generation position of the minute defects is separated from the end portion of the film by about 40 to 70 nm, so the stress is not so large at that position). However, the above-mentioned STI stress becomes about 500 Mpa according to the measurement with Raman microscopy or the like in the case of general MOS-FETs. Therefore, this STI stress greatly influences the minute defects and the large defects traversing a pn junction in the actual process. For that reason, this method is particularly effective when the STI stress exists.

Figure 11:
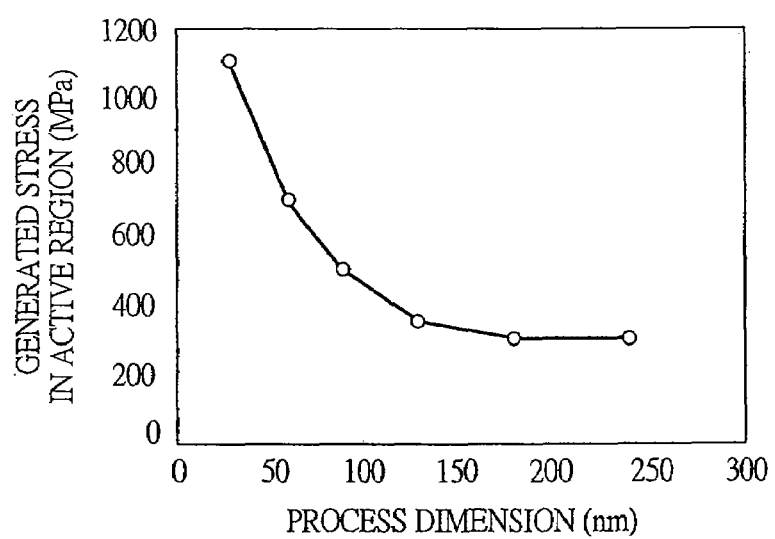
FIG. 11 is a graph showing the relation between a process dimension of a semiconductor device and a generated stress in active regions.

The STI stress increases as the dimension structure (process dimension) of the shallow trench isolation region is miniaturized as shown in FIG. 11, (in the case where the total amount of oxidation is about 20 to 30 nm on the surface of the semiconductor substrate and the oxidation temperature is 850 to 1000° C.). Therefore, this method is particularly effective when the process dimension of elements is 90 nm or less.

Figure 12:
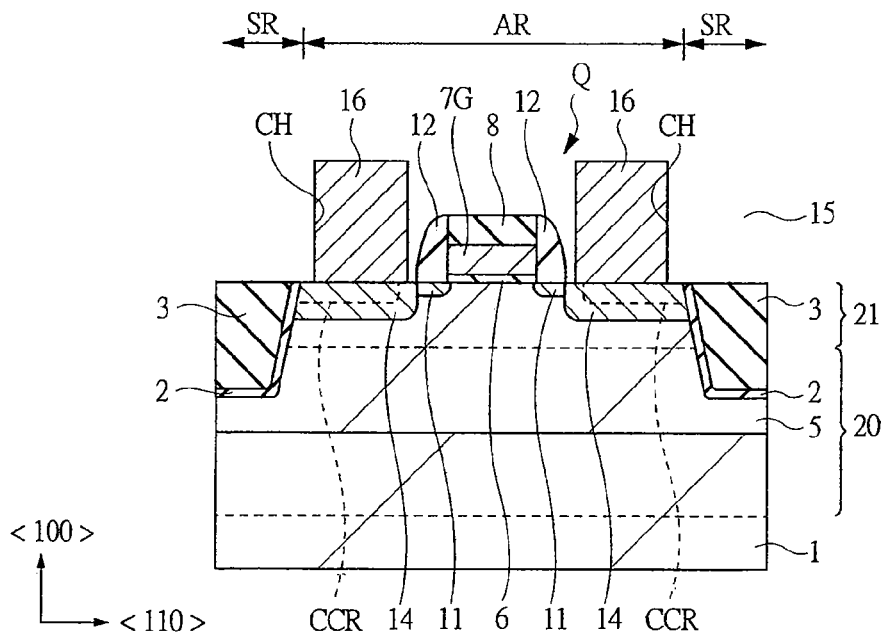
FIG. 12 is a principal cross-sectional view of a principal part of a semiconductor device having a silicon-germanium layer in a semiconductor substrate.

Meanwhile, as an attempt to improve the electrical characteristics, the so-called strained silicon obtained by, for example, deposited silicon germanium layer (SiGe) and forming a silicon epitaxial layer thereon, and then applying distortions to the silicon epitaxial layer has been developed in recent years. FIG. 12 is a cross-sectional view of a principal part of a semiconductor substrate 1 showing an example thereof. A strained silicon layer 21 is formed by an epitaxial method on the semiconductor substrate 1 via an SiGe layer 20.

In this case, since the stress caused by the SiGe layer 20 is applied to the source and drain regions (low concentration layer 11 and high concentration layer 14) in the same manner as of the STI stress, the method described in the present embodiment is effective even when adopting these structures. In other words, when adopting any process or structure which causes the stress to the source and drain regions (low concentration layer 11 and high concentration layer 14), the method described in the present embodiment is effective.

Second Embodiment

Manufacturing process for a semiconductor device according to the second embodiment will be described with reference to FIG. 13 to FIG. 18.

Figure 13:
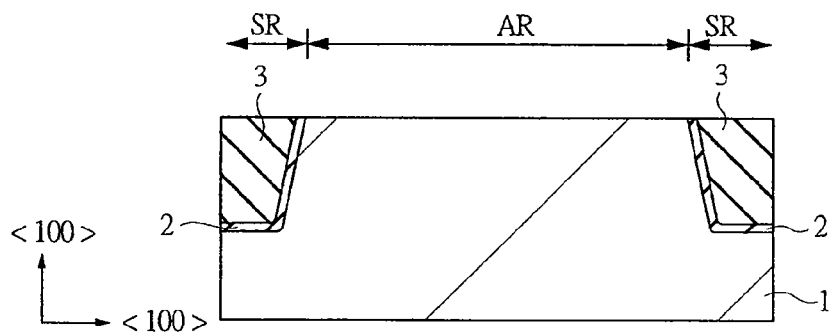
FIG. 13 is a cross-sectional view of a principal part of a semiconductor device in a manufacturing process according to another embodiment (second embodiment)

First, as shown as in FIG. 13, shallow trenches are formed in the semiconductor substrate 1 whose main surface is the (100) plane in perpendicular to or parallel to the <110> direction. The trenches are thermally oxidized at about 1000° C., thereby forming thermal oxide films 2 with 5 to 20 nm thickness.

Thereafter, the trenches are filled with an embedded oxide film 3 formed by a CVD or a sputtering method. Then, in order to remove voids therein, the embedded oxide film 3 is made to be densely packed by performing an annealing treatment in diluted oxidation atmosphere or nitrogen atmosphere at 1000 to 1150° C. for one to two hours.

Furthermore, the unnecessary embedded oxide film 3 on the semiconductor substrate 1 is planarized and removed, whereby shallow trench isolation regions SR, (shallow trench isolation (STI) region), are formed. Other regions except the shallow trench isolation regions SR become active region (AR).

Figure 14:
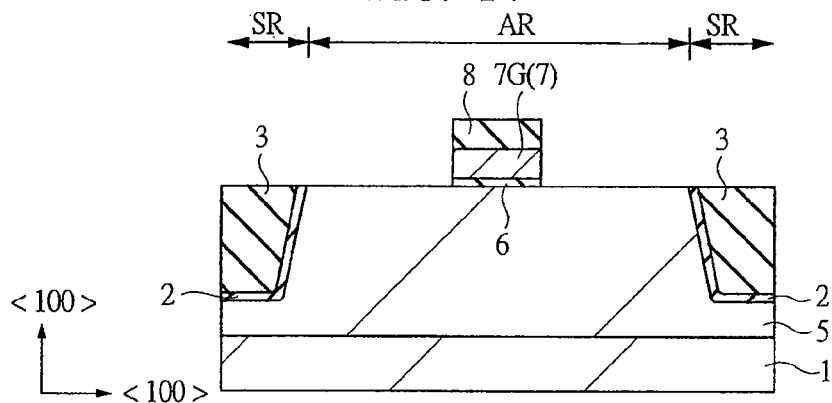
FIG. 14 is a cross-sectional view of a principal part of a semiconductor device in a manufacturing process continued from FIG. 13.

Next, as shown in FIG. 14, a thermal oxide film having about 10 nm thickness is formed by performing a heat treatment to the surface of the semiconductor substrate 1 at 900° C. in oxygen atmosphere. After that, an impurity such as boron (B) or arsenic (As) is implanted into the semiconductor substrate 1 with the impurity concentration of about $1 \times 10^{13}$ atoms/cm$^2$ using this thermal oxide film as a buffer layer, thereby forming a well layer 5 is formed.

Thereafter, the thermal oxide film is removed by diluted hydrofluoric acid (HF). Then, a gate oxide 6, a polysilicon film 7, and an insulator film 8 made of a dioxide film and the like are sequentially deposited. A gate electrode 7G is then formed by patterning the stacked layer, and at the same time, the longitudinal direction of or the short side direction of the gate electrode 7G is set to be perpendicular to or parallel to the <110> direction.

Figure 15:
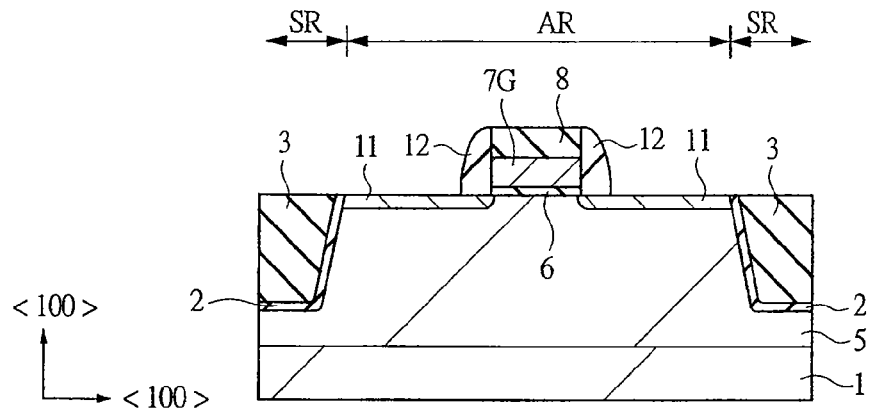
FIG. 15 is a cross-sectional view of a principal part of a semiconductor device in a manufacturing process continued from FIG. 14.

Next, as shown in FIG. 15, a thermal oxide film having 3 to 10 nm thickness is formed on the surface of the semiconductor substrate 1 by applying a heat treatment to the semiconductor substrate 1 in oxygen atmosphere at 900° C. Subsequently, boron (for P channel type MOS·FET) and arsenic (for N channel type MOS·FET) are implanted into the semiconductor substrate 1 with the impurity concentration of about $1 \times 10^{13}$ atoms/cm$^2$ using this thermal oxide film as a buffer layer, thereby forming low concentration layers.

Figure 16:
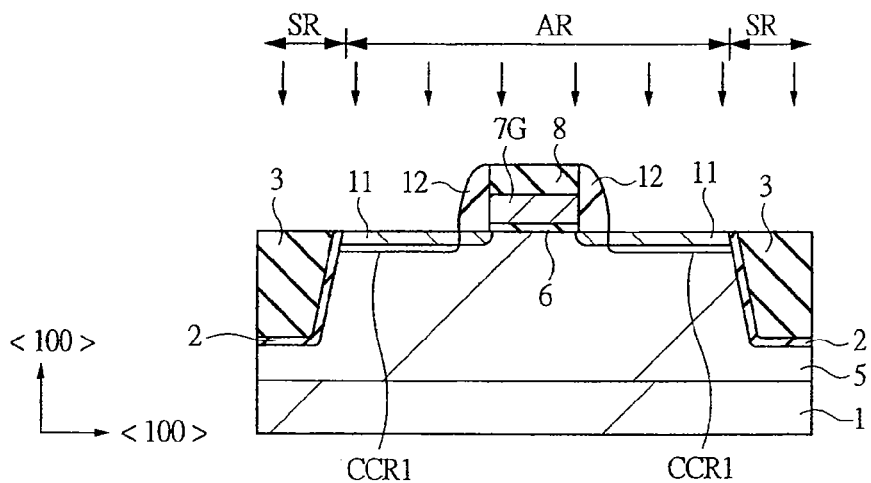
FIG. 16 is a cross-sectional view of a principal part of a semiconductor device in a manufacturing process continued from FIG. 15.

Next, as shown as in FIG. 16, first sidewalls 12 are deposited in the same manner as described above. After that, the first sidewalls 12 are left only on the sidewalls of the gate electrode 7G by anisotropically dry etching, thereby forming an LDD structure.

Thereafter, nitrogen (N$_2$) is implanted into the semiconductor substrate 1 at 10 to 15 KeV and with the impurity concentration of about $1 \times 10^{15}$ atoms/cm$^2$ using the first sidewalls 12 as a mask, thereby forming crystallization-control regions (CCR1).

The end portion of the crystallization-control region (CCR1) on a side of the gate electrode 7G is separated from the end portion of the gate electrode 7G by the distance of the width of the first side wall 12. In other words, the end portion of CCR1 is formed at the position of the side surface of the first sidewall 12.

Figure 17:
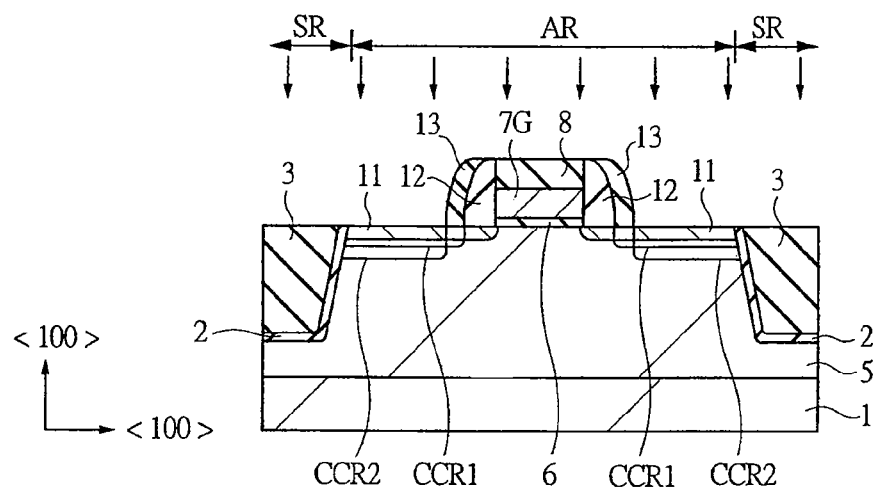
FIG. 17 is a cross-sectional view of a principal part of a semiconductor device in a manufacturing process continued from FIG. 16.

Next, as shown in FIG. 17, second sidewalls 13 are formed only on the sidewalls of the gate electrode 7G in the same manner described above, nitrogen is implanted into the semiconductor substrate 1 at 20 to 40 KeV and with the impurity concentration of about $1 \times 10^{15}$ to $3 \times 10^{15}$ atoms/cm$^2$ using the second sidewalls 13 as a mask, thereby forming a crystallization-control regions (CCR2).

The crystallization-control regions (CCR2) are formed from the main surface of the semiconductor substrate 1 to a deeper position compared to the crystallization-control region CCR1. Also, the end portion of the crystallization-control region CCR2 on a side of the gate electrode 7G is separated from the side surface of the first sidewall 12 by the distance of the width of the second sidewall 13. In other words, the end portion of CCR2 is formed at the position of the side surface of the second sidewall 13.

Figure 18:
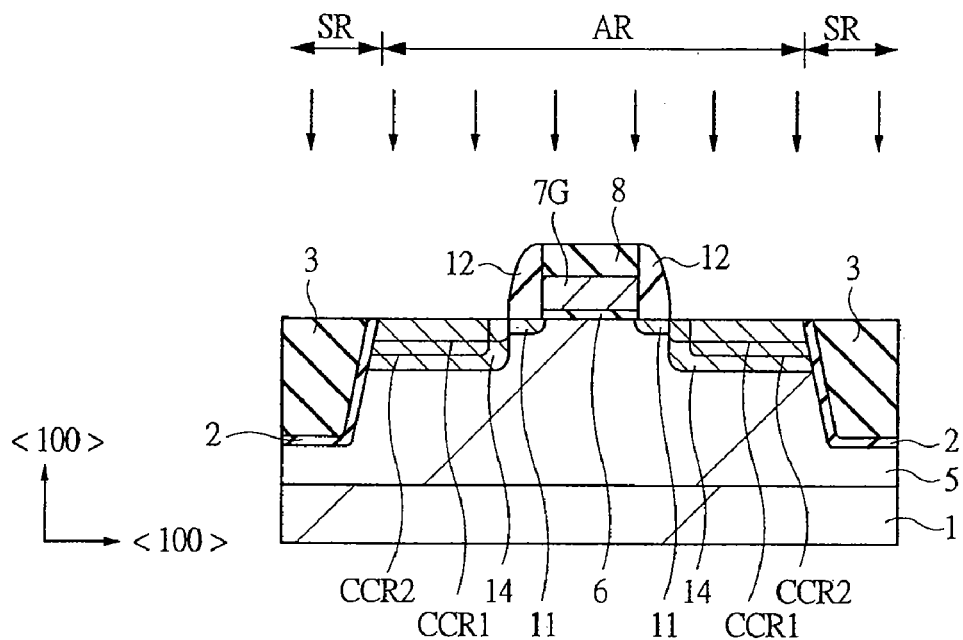
FIG. 18 is a cross-sectional view of a principal part of a semiconductor device in a manufacturing process continued from FIG. 17.

Next, as shown in FIG. 18, all the second sidewalls 13 are removed, and then boron (for P channel type MOS·FET) and arsenic (for N channel type MOS·FET) are implanted into the semiconductor substrate 1 at 50 KeV with the impurity concentration of about $5 \times 10^{14}$ to $3 \times 10^{15}$ atoms/cm$^2$. Subsequently, an annealing treatment at about 1000° C. is performed so as to form high concentration layers 14 for a source and a drain.

The high concentration layers 14 are formed from the main surface of the semiconductor substrate 1 to a deeper position compared to the crystallization-control region CCR1 and the crystallization-control region CCR2. Meanwhile, the end portion of the high concentration layer 14 on the side of the gate electrode 7G is located almost at the position of the side surface of the first sidewall 12. Consequently, the end portion of the high concentration layer 14 on the side of the gate electrode 7G and the end portion of the crystallization-control region CCR1 on the side of the gate electrode 7G substantially overlap each other. Also, the high concentration layer 14 includes a region close to the first sidewall 12 relative to the crystallization-control region CCR 2. In other words, the crystallization-control region CCR 2 is included in the high concentration layer 14.

Figure 19:
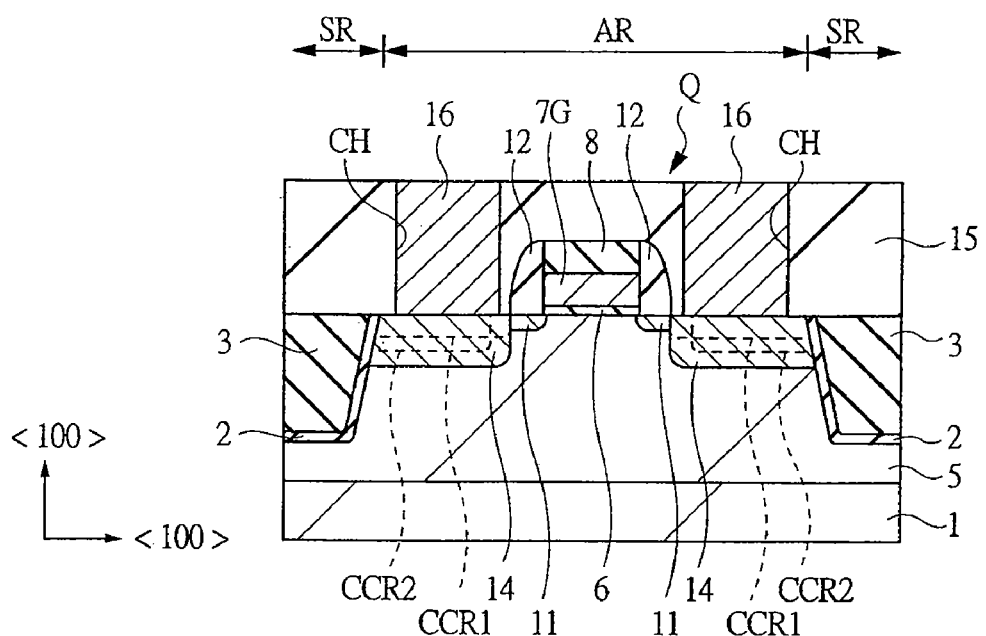
FIG. 19 is a cross-sectional view of a principal part of a semiconductor device in a manufacturing process continued from FIG. 18.

Next, as shown in FIG. 19, an oxide film 15 is deposited on the semiconductor substrate 1, and contact holes CH are formed in the oxide film 15, in the same manner as the first embodiment. Subsequently, a conductive film such as tungsten is deposited on the oxide film 15 on the semiconductor substrate 1 so that the contact holes CH are filled with the conductive film. Thereafter, unnecessary parts of the conductive film are removed by a chemical mechanical polish method or an etch-back method, thereby forming plugs 16 in the contact holes CH. The plugs 16 are electrodes electrically connected to the high concentration layers 14 for a source and a drain. In this way, a MOS·FET Q is formed on the semiconductor substrate 1.

In addition, in the same manner as the first embodiment, a silicide layer may be provided between the plug 16 and the semiconductor substrate 1. Also, the plug 16 may be made of a polysilicon film.

Figure 20:
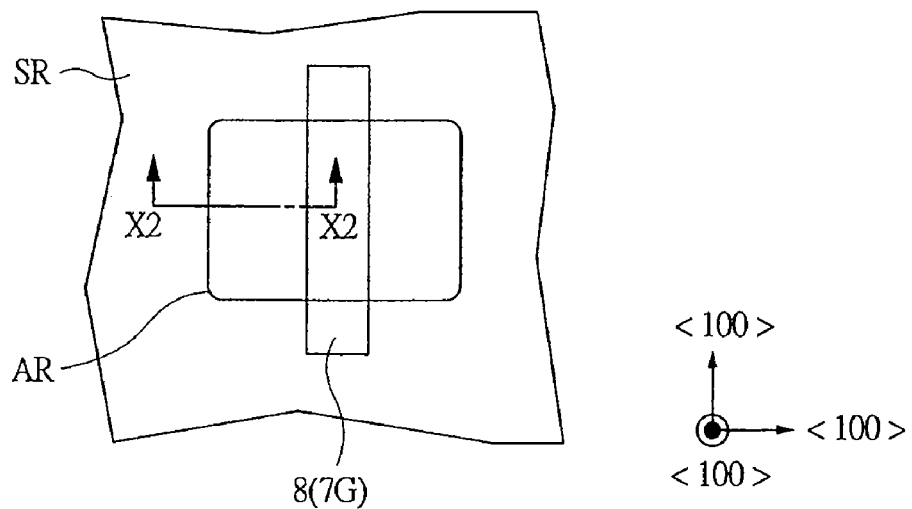
FIG. 20 is a plan view of a principal part of a semiconductor substrate of a semiconductor device according to another embodiment (second embodiment) of the present invention.
Figure 21:
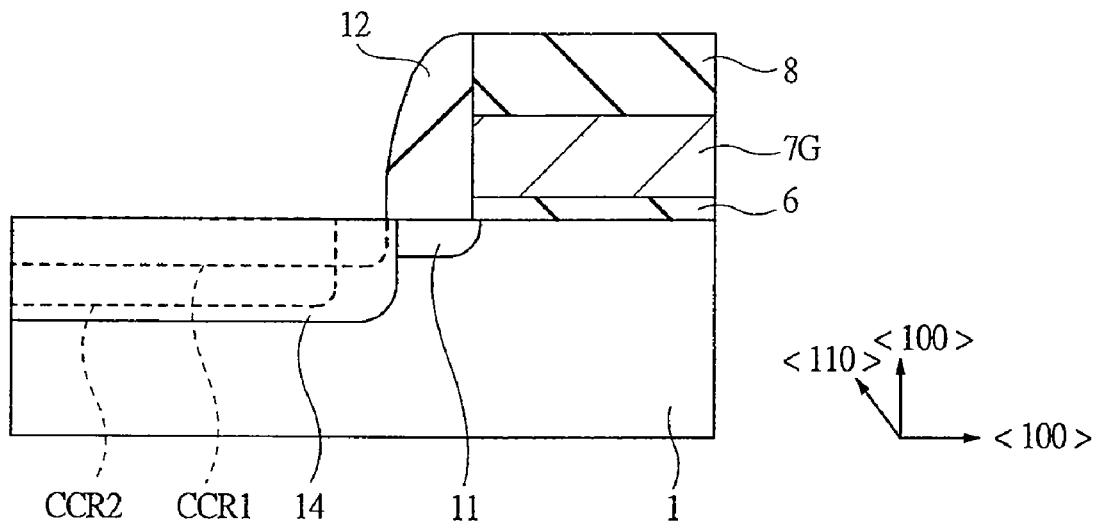
FIG. 21 is a cross-sectional view taken along the line X2-X2 in FIG. 20.

According to the second embodiment, the main surface of the semiconductor substrate 1 is the (100) plane, and the longitudinal direction of or the short side direction of the gate electrode 7G is set to be the <001> direction. Therefore, different from FIG. 7 and FIG. 8 described above, the characteristic planes of the amorphous layer after implanting impurities into the source and drain regions are only the planes of the (100) and the (110) as shown in FIG. 20 and FIG. 21. FIG. 20 is a plane view of a principal part of the semiconductor substrate 1 and FIG. 21 is a cross-sectional view taken along the line X2-X2 in FIG. 20.

In this case, an amorphous recess portion at the LDD end portion (end portion of the first sidewall 12) is the (110) plane, and both sides of the plane are the (100) planes which has a faster cystallization rate. Therefore, minute defects occur in this case. In order to suppress or prevent the minute defects in such a case, it is necessary to reduce the cystallization rate of the (100) plane existing on the both sides of the (110) plane.

So, according to the second embodiment, after forming the LDD (first sidewall 12), the crystallization-control region CCR1 is formed by implanting nitrogen into a shallower position than the high concentration layer 14. Thereafter, after forming a second sidewall 13 on the sidewall of the LDD (the first sidewall 12), nitrogen is further implanted into a deeper position compared to the previous nitrogen implantation. By doing so, nitrogen can be implanted into the (100) plane region existing on the both sides of the (110) plane without implanting nitrogen into the (110) plane side. Therefore, since the dependence on the crystal surface orientation with respect to the crystallization rate can be reduced, the occurrence of the minute defects can be suppressed. Further, the occurrence of large defects (dislocation) traversing a pn junction, which causes undesirable electrical influence, can be suppressed or prevented.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to the semiconductor device manufacture industry.

What is claimed is:

1. A method of manufacturing a semiconductor device, comprising the steps of:

forming a gate insulator film on a (100) plane of a semiconductor substrate;
forming a gate electrode on the gate insulator film;
forming a first gate film on a side of the gate electrode;
forming a second gate film on the first gate film;
implanting one of nitrogen, oxygen, carbon or argon as a first impurity into the semiconductor substrate, using the second gate film as a mask;
removing the second gate film;
implanting a second impurity into the semiconductor substrate, using the first gate film as a mask, wherein the implantation depth of the second impurity is greater than the implantation depth of the first impurity; and
crystallizing the semiconductor substrate implanted with the first impurity or the second impurity.

2. The method of manufacturing a semiconductor device according to claim 1,
wherein the second impurity is one of boron, arsenic, or phosphorous.

3. The method of manufacturing a semiconductor device according to claim 1,
wherein the semiconductor substrate includes an SiGe layer.

4. The method of manufacturing a semiconductor device according to claim 1,
wherein the region in which the second impurity is implanted is to be a source or a drain, and
a direction from the source to the drain is parallel to a <110> direction.

5. A method of manufacturing a semiconductor device, comprising the steps of:

forming a gate insulator film on a (100) plane of a semiconductor substrate;
forming a gate electrode on the gate insulator film;
forming a first gate film on a side of the gate electrode;
implanting one of nitrogen, oxygen, carbon or argon as a first impurity into the semiconductor substrate, using the first gate film as a mask;
implanting a second impurity into a larger region than the region in which the first impurity is implanted in the semiconductor substrate; and
crystallizing the semiconductor substrate implanted with the first impurity or the second impurity.

6. The method of manufacturing a semiconductor device according to claim 5,
wherein the second impurity is one of boron, arsenic, or phosphorous.

7. The method of manufacturing a semiconductor device according to claim 5,
wherein the semiconductor substrate includes an SiGe layer.

8. The method of manufacturing a semiconductor device according to claim 5,
wherein the region in which the second impurity is implanted is to be a source or a drain, and
a direction from the source to the drain is parallel to a <110> direction.

* * * * *